Sept. 8, 1959 R. A. FLOWER 2,903,522

TRANSISTOR AMPLIFIER

Filed July 7, 1955

INVENTOR.
ROBERT A. FLOWER

BY H. L. Mackey

ATTORNEY.

United States Patent Office 2,903,522

Patented Sept. 8, 1959

2,903,522

TRANSISTOR AMPLIFIER

Robert A. Flower, White Plains, N.Y., assignor to General Precision Laboratory Incorporated, a corporation of New York Application July 7, 1955, Serial No. 520,390

2 Claims. (Cl. 179—171)

This invention relates to transistor amplifiers and particularly such amplifiers in which an automatic gain control circuit is incorporated.

Automatic control of gain by controlling the bias of a stage or stages, as is usual in vacuum tube amplifiers, is not possible in transistor amplifiers where wide range control with little distortion is a requirement. In order to accomplish the desired results the instant invention employs a gain adjustment in a negative feedback loop, utilizing in this loop amongst other things a second negative feedback loop for controlling the gain. By such an arrangement the invention controls the gain over a very wide range of input signal amplitude and secures a substantially constant amplitude amplifier output signal having little distortion at any input signal strength.

One purpose of this invention is to provide a transistor amplifier having substantially constant undistorted output over a wide range of input amplitude variation.

Another purpose of this invention is to provide a transistor negative feedback amplifier having a gain-controlled stage in the feedback channel for varying the the amount of negative feedback in direct proportion to the magnitude of the output signal.

A further understanding of this invention may be secured from the detailed description and associated drawing, in which.

Figure 1:
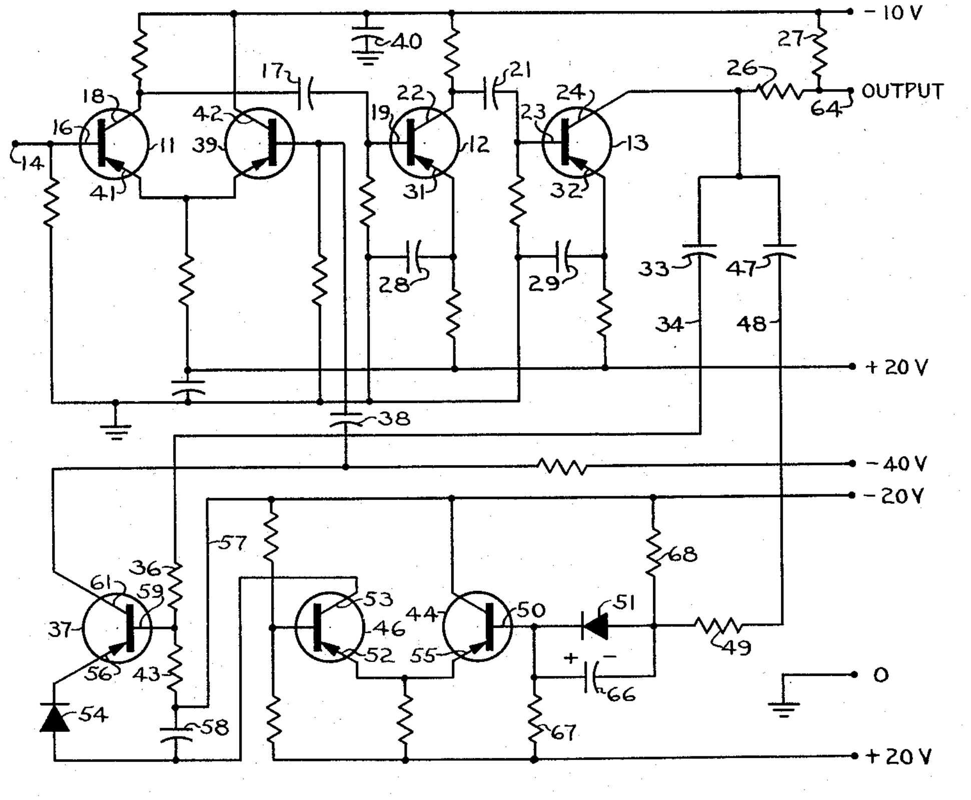
Figure 1 is a circuit diagram of an embodiment of the invention.

Referring now to Fig. 1, the transistors 11, 12 and 13 comprise a three-stage, grounded-emitter, R.C.-coupled audio amplifier. The input signal is applied from terminal 14 to the base terminal 16 of transistor 11. Capacitor 17 couples the first stage collecor 18 to the second stage base 19, and capacitor 21 couples the second stage collector 22 to the third stage base 23. The output is taken from the collector 24 of the third stage through a resistor 26, the resistance of the voltage-supply resistor 27 being low to secure a low-impedance output. Bypass capacitors 28 and 29 are provided in the second and third stages to ground their emitters 31 and 32 for audio signal voltages.

A negative feedback path is provided from output collector 24 through capacitor 33, conductor 34, resistor 36, feedback control transistor 37, capacitor 38 and transistor 39 to the first-stage emitter 41. The collector 42 of transistor 39 is effectively grounded through condenser 40 so that its operation is analogous to that of a vacuum tube cathode follower. A voltage divider consisting of the resistor 36 and resistor 43 provides a selected amount of feedback signal to the control transistor 37.

The control transistor 37 constitutes an amplifiying stage whose gain is varied over a wide range through the action of transistors 44 and 46 which are connected as an emitter-coupled differential amplifier. The amplifier output signal is applied through capacitor 47, conductor 48, and resistor 49 to a rectifier 51, which may be a crystal diode. The rectified signal which is proportional to the voltage at output 64 is applied to base 50 of the grounded-collector transistor 44, and the power-amplified direct-current signal output from its emitter 55 is applied to the emitter 52 of the transistor 46. Transistor 46 is operated as a grounded base stage, so that its emitter presents low impedance to the input direct current signal and its collector 53 has high impedance. As the voltage at output 64 increases, the rectified signal across rectifier 51 increases decreasing the current in emitter 55 and increasing the current in collector 53. The collector 53 is connected through a crystal diode 54 to the emitter 56 of transistor 37 and therefore provides emitter bias proportional to the signal at output 64. A —20-volt bus 57 is connected to the lower end of resistor 43 for providing bias to base 59 and a large capacitor 58 is connected between bus 57 and diode 54 to provide a low impedance return for audio frequencies.

Diode 54 is used as a variable resistance rather than as a rectifier. Its resistance varies inversely as the current passed through it in the forward direction and thus it behaves like a varistor. In fact, any varistor-type resistor having the right variation of resistance with current may be used in place of a crystal diode.

The resistance introduced by the diode 54 is in the common return of both the input and output circuits of transistor 37, and therefore causes degeneration in proportion to the magnitude of the resistance. The input signal circuit may be traced from resistor 36 through base electrode 59, emitter 56, diode 54, and capacitor 58 to the —20-volt bus 57, and the output signal circuit returns from collector 61 through emitter 56 and also through diode 54 and capacitor 58 to the —20-volt bus 57.

Figure 2:
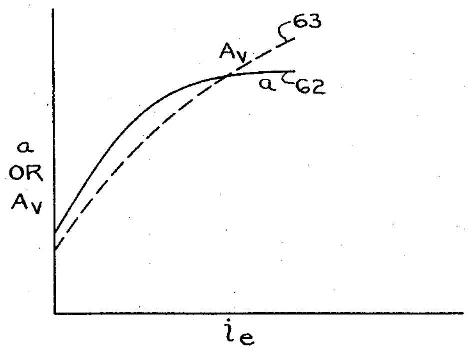
Figure 2 is a graph illustrating the operation of the invention.

The grounded-emitter control transistor 37 has a current amplification factor, $a$, which increases with increasing emitter current in a non-linear manner, generally as indicated by curve 62, Fig. 2. The voltage amplification, $A_v$, of the stage is a function of $a$ and also of the total emitter resistance in accordance with the equation, $$A_v = \frac{-ar_L}{r_e + r_b(1-a) + r_d} \qquad (1)$$

in which $r_L$ is the load resistance, $r_e$ is the emitter resistance, $r_d$ is the resistance of diode 54, and $r_b$ is the base resistance. As the emitter current increases $a$ increases, and $r_e$ decreases, as does $r_d$, thus increasing $A_v$ more rapidly than if $a$ alone should change. In addition the distortion represented by the knee of the $a$ curve 62, Fig. 2, is greatly diminished by the degeneration resulting from the increases in $r_d$ with decrease in emitter current. As the result of these several effects, the $A_v$ curve 63, Fig. 2 is much more nearly linear than curve 62 and has a greater range.

As an example of operation, let it be assumed that a weak audio frequency signal having an amplitude of one millivolt is applied to the input terminal 14, producing an output signal at terminal 64 of one-quarter volt and an output at collector 24 of 2.32 volts using selected values for resistors 26 and 27, thus providing a negative feedback signal in conductor 34 and a control signal in conductor 48. The latter, after rectification in rectifier 51 and amplification in transistors 44 and 46, applies a certain relatively low emitter bias current to transistor 37 and results in a relatively high resistance of diode 54 with high degeneration, both actions resulting in a minimum output signal voltage from transistor 37. Since this voltage is applied as negative signal feedback to the first stage transistor 11, the minimum feedback value results in maximum overall amplifier amplification.

If now the input signal at terminal 14 be increased by a factor of 100 to one-tenth volt, the output at collector 24 tends to increase. This increases the negative feedback signal in conductor 34 and through transistors 37 and 39 tends to reduce the output signal. Also the control signal in conductor 48 is increased, increasing the current amplification factor $a$ of transistor 37 and thus increasing the amplification in the degeneration loop of the main amplifier, decreasing the overall gain. Additionally the increased control signal reduces the resistance of diode 54 which has two effects: it further increases $a$ and therefore $A_v$, increasing the amplification of transistor 37, and also decreases $r_d$, again increasing $A_v$ and at the same time making the control characteristic of transistor 37 more nearly linear. The most advantageous result of this increased linearity is to decrease the tendency to distortion in transistor 37 as described above. The heightened overall gain of transistor 37 being in the negative feedback loop of the main amplifier, the output at terminal 64 is permitted to rise only slightly, its change in fact being less than 20% when the input to the main amplifier changes by a factor of 100.

It is desirable that the gain control circuit respond to changes of audio input signal amplitude fast enough to prevent audible transients, but not so fast as to change the gain during an audio cycle. In order to control the rate of response, capacitor 66 is connected in shunt with rectifier 51, its size and the magnitudes of resistors 67 and 68 being selected to provide the proper rate of control.

What is claimed is:

1. An automatically gain-controlled transistor amplifier comprising, a main transistor amplifier having input and output circuits, a control transistor amplifier having at least collector, emitter and base elements, a common-emitter circuit included in said control transistor amplifier, a signal load resistor circuit connected to said collector element, an input signal circuit connected to said base element, and a semiconductor diode having one terminal connected in series with said emitter element, the diode being forwardly conductive in the forward emitter current direction and having a resistance inversely varying with the forward current therein, power supply means connected to said signal load resistor circuit and to said input signal circuit, a capacitor having one terminal connected to the other terminal of said diode, a conductive connection between the other terminal of said capacitor and said power supply means whereby a signal return path is provided for both input signal circuit and said signal load resistor circuit, a capacitor connecting said output circuit of the main transistor amplifier to said input signal circuit, a capacitor connecting said collector element to said input circuit of the main transistor amplifier to complete a negative feedback loop, a rectifier responsive to output signals of said main transistor amplifier and producing therefrom a direct current representative of the magnitude thereof, a transistor amplifier amplifying said direct current, said transistor amplifier having a collector output terminal, and a conductive connection between said collector output terminal and the other terminal of said semiconductor diode whereby the amplified direct current constitutes the control transistor amplifier emitter current and also the current varying the resistance of said diode thereby quadruply controlling the gain of said main amplifier to maintain constant output of said main resistor amplifier over a wide range of input amplitudes.

2. An automatically and linearly gain-controlled transistor comprising, a main transistor amplifier having input and output circuits, a control transistor amplifier having at least collector, emitter and base elements, the current amplification factor ($a$) thereof being nonlinearly proportional to the emitter current at low currents, a common-emitter circuit included in said control transistor amplifier, a signal load resistor circuit connected to said collector element, an input signal circuit connected to said base element, a semiconductor diode having first and second terminals, said first terminal being connected to said emitter element, said diode being forwardly conductive in the forward emitter current direction and having a resistance ($r_d$) inversely variable with said forward emitter current, power supply means connected to said signal load resistor circuit and to said input signal circuit, a capacitor having one terminal connected to said second diode terminal, a conductive connection between the other terminal of said capacitor and said power supply means whereby a signal return path is provided for both input signal circuit and said signal load resistor circuit, a capacitor connecting said output circuit of the main transistor amplifier circuit to said input signal circuit, a capacitor connecting said collector element to said input circuit of the main transistor amplifier to complete a negative feedback loop, a rectifier responsive to the output signals of said main transistor amplifier and producing therefrom direct current representative in magnitude of the magnitude thereof, a transistor amplifier amplifying said direct current, said transistor amplifier having a collector output terminal, and a conductive connection between said collector output terminal and said second diode terminal whereby the amplified direct current constitutes the control transistor amplifier emitter current thereby controlling emitter internal resistance ($r_e$) and controlling the transistor current amplification factor ($a$), also thereby controlling the diode resistance ($r_d$) whereby the total effect of said amplified direct current on the control transistor voltage gain is linear, resulting in non-distorting gain control of the main amplifier over the entire gain range.

References Cited in the file of this patent

UNITED STATES PATENTS

| | | |
|---|---|---|
| 2,208,665 | Crabtree | July 23, 1940 |
| 2,212,337 | Brewer | Aug. 20, 1940 |
| 2,290,084 | Albright | July 14, 1942 |
| 2,313,096 | Shepard, Jr. | Mar. 9, 1943 |
| 2,554,211 | Barton | Mar. 6, 1951 |
| 2,554,905 | Hawkins | May 29, 1951 |
| 2,663,002 | McManis et al. | Dec. 15, 1953 |
| 2,745,068 | Garnett | May 8, 1956 |
| 2,751,446 | Bopp | June 19, 1956 |
| 2,757,246 | Radcliffe | July 31, 1956 |

OTHER REFERENCES

Stern: "Transistor Broadcast Receivers," pages 1107–1112 (Fig. 6) "Electrical Engineering," December 1954 (179–171.MB).

Bell: "The Transistor," copyright 1951 by Bell Telephone Laboratories, Inc. (particularly pages 127–165, 402 and 408).

Shea text, "Principles of Transistor Circuits," Sept. 15, 1953, page 41. (Copy in Classification Division II.)